(12) United States Patent
Kim et al.

(10) Patent No.: US 10,325,671 B2
(45) Date of Patent: Jun. 18, 2019

(54) MEMORY SYSTEM HAVING IMPEDANCE CALIBRATION CIRCUIT

(71) Applicant: SK hynix Inc., Gyeonggi-do (KR)

(72) Inventors: Hee Jun Kim, Gyeonggi-do (KR); Minsoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/970,242

(22) Filed: May 3, 2018

(65) Prior Publication Data

US 2019/0080784 A1 Mar. 14, 2019

(30) Foreign Application Priority Data

Sep. 11, 2017 (KR) .......................... 10-2017-0116037

(51) Int. Cl.
*G11C 29/50* (2006.01)
*G11C 11/4099* (2006.01)
*G11C 11/4093* (2006.01)

(52) U.S. Cl.
CPC .... *G11C 29/50008* (2013.01); *G11C 11/4093* (2013.01); *G11C 11/4099* (2013.01)

(58) Field of Classification Search
None
See application file for complete search history.

(56) References Cited

U.S. PATENT DOCUMENTS

| | | | |
|---|---|---|---|
| 2012/0025800 A1* | 2/2012 | Dettloff | H04L 25/0272 323/299 |
| 2012/0072650 A1 | 3/2012 | Suzumura et al. | |
| 2012/0146687 A1* | 6/2012 | Kim | H03K 19/0005 326/30 |
| 2016/0204782 A1* | 7/2016 | Lee | H03K 19/017545 365/189.17 |
| 2016/0284386 A1* | 9/2016 | McCall | G11C 7/1057 |

FOREIGN PATENT DOCUMENTS

KR 1020100103146 9/2010

* cited by examiner

*Primary Examiner* — Jany Richardson
(74) *Attorney, Agent, or Firm* — IP & T Group LLP (57) ABSTRACT

A memory system includes: a buffer memory device including a reference voltage pad; a memory controller including a controller ZQ pad; and a controller calibration resistor, wherein the reference voltage pad, the controller ZQ pad, and the controller calibration resistor are coupled to each other.

19 Claims, 9 Drawing Sheets

MEMORY SYSTEM HAVING IMPEDANCE CALIBRATION CIRCUIT

CROSS-REFERENCE TO RELATED APPLICATION

The present application claims priority under 35 U.S.C. § 119(a) to Korean patent application number 10-2017-0116037, filed on Sep. 11, 2017, the disclosure of which is incorporated herein by reference in its entirety.

BACKGROUND

1. Field

Various exemplary embodiments of the present disclosure generally relate to a memory system. Particularly, the embodiments relate to an impedance calibration circuit of a memory system.

2. Description of the Related Art

In general, a memory system includes a nonvolatile memory device, a buffer memory device, and a memory controller. The memory controller exchanges data with the buffer memory device at high speed. When the memory controller receives data from the buffer memory device, a data signal output from an output buffer of the buffer memory device is input to an input buffer of the memory controller. At this time, a signal reflection inevitably occurs. The signal reflection refers to a phenomenon in which a portion of a data signal input to the input buffer of the memory controller is reflected to a data transmission line due to mismatching between input impedance of input/output terminal in the input buffer of the memory controller and impedance of the data transmission line.

The signal reflection is not problematic when the speed of the output data signal is not high. However, if the speed of the output data signal goes beyond a certain speed, a problem may arise in which the memory controller may not stably receive the data signal due to the signal reflection. That is, a data signal that is output from the buffer memory device may be interfered by a reflected signal of a data signal previously output from the buffer memory device. The signal reflection occurs similarly even when data is output. In order to prevent the signal reflection, an impedance calibration circuit such as an on die termination calibration circuit is provided at a data input/output terminal of the memory controller, so that the impedance of the data input/output terminal of the memory controller is matched to the impedance of the data transmission line.

SUMMARY

Embodiments provide a memory system including an impedance calibration circuit configured to reduce the area thereof.

According to an aspect of the present disclosure, there is provided a memory system including: a buffer memory device including a reference voltage pad; a memory controller including a controller ZQ pad; and a controller calibration resistor, wherein the reference voltage pad, the controller ZQ pad, and the controller calibration resistor are coupled to each other.

According to an aspect of the present disclosure, there is provided a memory system including: a buffer memory device; a memory controller including a first pad; and a controller calibration resistor coupled to the memory controller through the first pad, wherein the memory controller performs an impedance calibration operation, based on the resistance of the controller calibration resistor, wherein the buffer memory device determines whether a data signal is logic 'high' or logic 'low' in a data input operation, based on a voltage output from the memory controller through the first pad.

According to an aspect of the present disclosure, there is provided a transmission system including: first and second devices; a transmission line suitable for transferring a signal between the first and second devices, wherein the first device matches impedances between the first device and the transmission line with reference to a first calibration resistance, and wherein the second device matches impedances between the second device and the transmission line with reference to a second calibration resistance and the voltage of the first calibration resistance when the first device completes the impedance matching.

BRIEF DESCRIPTION OF THE DRAWINGS

Example embodiments will now be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity. It will be understood that when an element is referred to as being "between" two elements, it can be the only element between the two elements, or one or more intervening elements may also be present. Like reference numerals refer to like elements throughout.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. Accordingly, the drawings and description are to be regarded as illustrative in nature and not restrictive.

In the entire specification, when an element is referred to as being "connected" or º "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention.

As used herein, singular forms may include the plural forms as well, unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
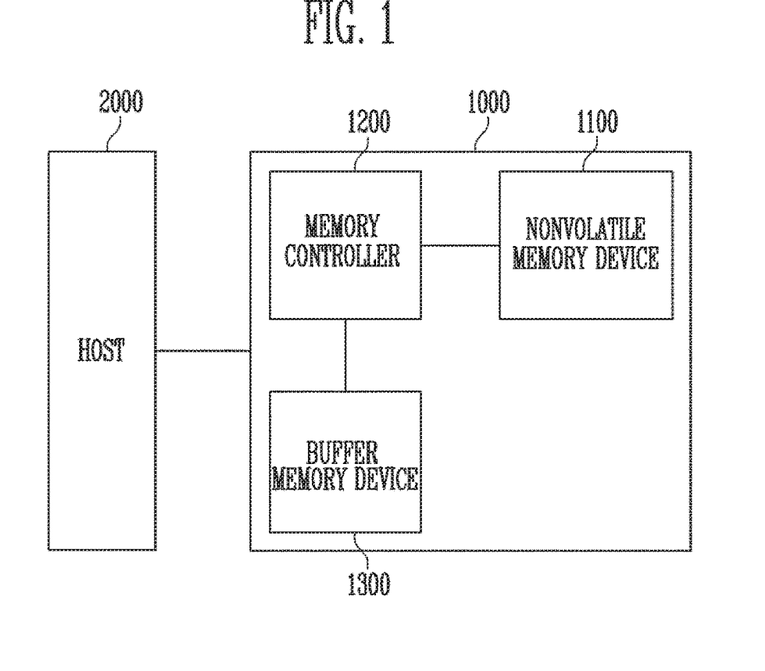
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a nonvolatile memory device 1100 that retains stored data even when power is cut off, a buffer memory device 1300 for temporarily storing data, and a memory controller 1200 that controls the nonvolatile memory device 1100 and the buffer memory device 1300 under the control of a host 2000.

The host 2000 may communicate with the memory system 1000, using at least one of various communication methods such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

The memory controller 1200 may control overall operations of the memory system 1000, and control data exchange between the host 2000 and the nonvolatile memory device 1100. For example, the memory controller 1200 may program or read data by controlling the nonvolatile memory device 1100 in response to a request of the host 2000. Also, the memory controller 1200 may store information of main memory blocks and sub-memory blocks, which are included in the nonvolatile memory device 1100, and select the nonvolatile memory device 1100 to perform a program operation on a main memory block or a sub-memory block according to the amount of data loaded for the program operation. In some embodiments, the nonvolatile memory device 1100 may include a flash memory.

The memory controller 1200 may control data exchange between the host 2000 and the buffer memory device 1300, or temporarily store system data for controlling the nonvolatile memory device 1100 in the buffer memory device 1300. The buffer memory device 1300 may be used as a working memory, a cache memory, or a buffer memory for the memory controller 1200. The buffer memory device 1300 may store codes and commands, which are executed by the memory controller 1200. Also, the buffer memory device 1300 may store data processed by the memory controller 1200.

The memory controller 1200 may temporarily store data input from the host 2000 in the buffer memory device 1300 and then transmit the data temporarily stored in the buffer memory device 1300 to the nonvolatile memory device 1100 to be stored in the nonvolatile memory device 1100. Also, the memory controller 1200 may receive data and a logical address, which are input from the host 2000, and transform the logical address to a physical address indicating a region in which data is to be actually stored in the nonvolatile memory device 1100. Also, the memory controller 1200 may store, in the buffer memory device 1300, a logical-to-physical address mapping table that establishes a mapping relationship between the logical address and the physical address.

In some embodiments, the buffer memory device 1300 may include a double data rate synchronous dynamic random access memory (DDR SDRAM), a low power double data rate fourth-generation (LPDDR4) SDRAM, a graphics double data rate (GDDR) SRAM, a low power DDR (LPDDR), a rambus dynamic random access memory (RDRAM), etc.

Figure 2:
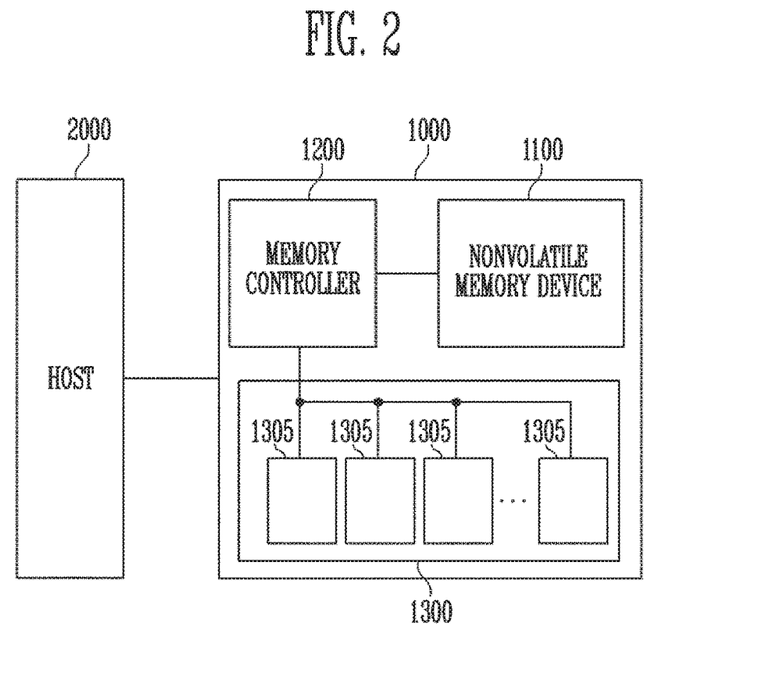
FIG. 2 is a diagram illustrating a memory system according to another embodiment of the present disclosure.

FIG. 2 is a diagram illustrating a memory system 1000 according to another embodiment of the present disclosure.

Referring to FIG. 2, the buffer memory device 1300 may be provided in the form of a module including one or more dynamic random access memories (DRAMs) 1305. The DRAMs 1305 may exchange data signals with the memory controller 1200 by sharing the same data transmission line. Here, the DRAM may be a double data rate fourth-generation synchronous dynamic random access memory (DDR4 SDRAM).

When a data signal output from the DRAM 1305 is input to an input buffer of the memory controller 1200, signal reflection may occur. The signal reflection refers to a phenomenon in which a portion of a data signal input to the input buffer of the memory controller is reflected to the data transmission line due to the mismatching between input impedance of input/output terminal in the input buffer of the memory controller and impedance of the data transmission line. An impedance calibration operation may be required to prevent data signal distortion caused by the signal reflection.

Figure 3:
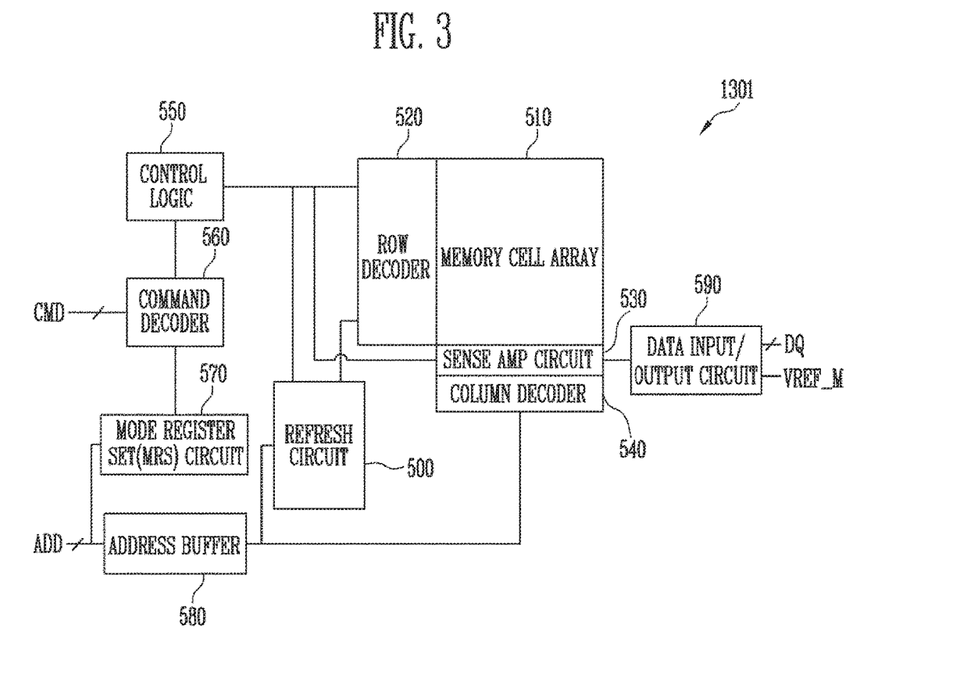
FIG. 3 is a diagram illustrating a dynamic random access memory (DRAM) of FIG. 2.

FIG. 3 is a diagram illustrating the one or more DRAMs 1305 of FIG. 2.

Referring to FIG. 3, the DRAMs 1305 may include a memory cell array 510, a row decoder 520, a sense amplifier circuit 530, a column decoder 540, a control logic 550, a command decoder 560, a mode register set (MRS) circuit 570, an address buffer 580, a data input/output circuit 590, and a refresh circuit 500.

The memory cell array 510 is a data storage in which a lot of memory cells are arranged in row and column directions. The memory cell array 510 includes a plurality of DRAM memory cells, and data stored in the DRAM memory cell may disappear when power is cut off. The sense amplifier circuit 530 may read data stored in the memory cell array 510 by sensing and amplifying a voltage difference between a bit line pair, based on the distribution of charges stored in a selected memory cell.

Data DQ input through the data input/output circuit 590 is written in the memory cell array 510, based on an address signal ADD. The data DQ read from the memory cell array 510 based on the address signal ADD is output to the outside through the data input/output circuit 590. The address signal ADD is input to the address buffer 580 to designate a memory in or from which data is to be written or read. The address buffer 580 temporarily stores the address signal ADD input from the outside.

The data input/output circuit 590 may receive a reference voltage input from an external device through a memory reference voltage pad VREF_M. The reference voltage may be a voltage that becomes a reference for determining whether a data signal is logic 'high' or logic 'low' when data is input.

The row decoder 520 decodes a row address in the address signal ADD output from the address buffer 580, to designate a word line coupled to a memory cell to or from which data is to be input or output. That is, the row decoder 120 enables a corresponding word line by decoding the row address output from the address buffer 580 in a data write or read mode.

The column decoder 540 decodes a column address in the address signal ADD output from the address buffer 580, to designate a bit line coupled to a memory cell to or from which data is to be input or output.

The command decoder 560 receives command signals CMD such as, e.g., a signal including /CBR, /CKE, etc., applied externally, and decodes the signal, thereby internally generating the decoded command signal. The MRS circuit 570 sets an internal mode register in response to the address signal ADD and an MRS command for designating an operation mode of the DRAM 1305. The control logic 550 may control an operation of the DRAM 1305 in response to a command output from the command decoder 560.

The refresh circuit 500 may control a refresh operation of reading data stored and then re-writing the read data in preparation for a case where charges stored in a capacitor of each of the DRAM memory cells included in the memory cell array 510 disappear.

In addition, although not shown in FIG. 3, the DRAM 1305 may further include a clock circuit for generating a clock signal, a power circuit for generating or dividing an internal voltage by receiving a power voltage applied externally, and the like.

Figure 4:
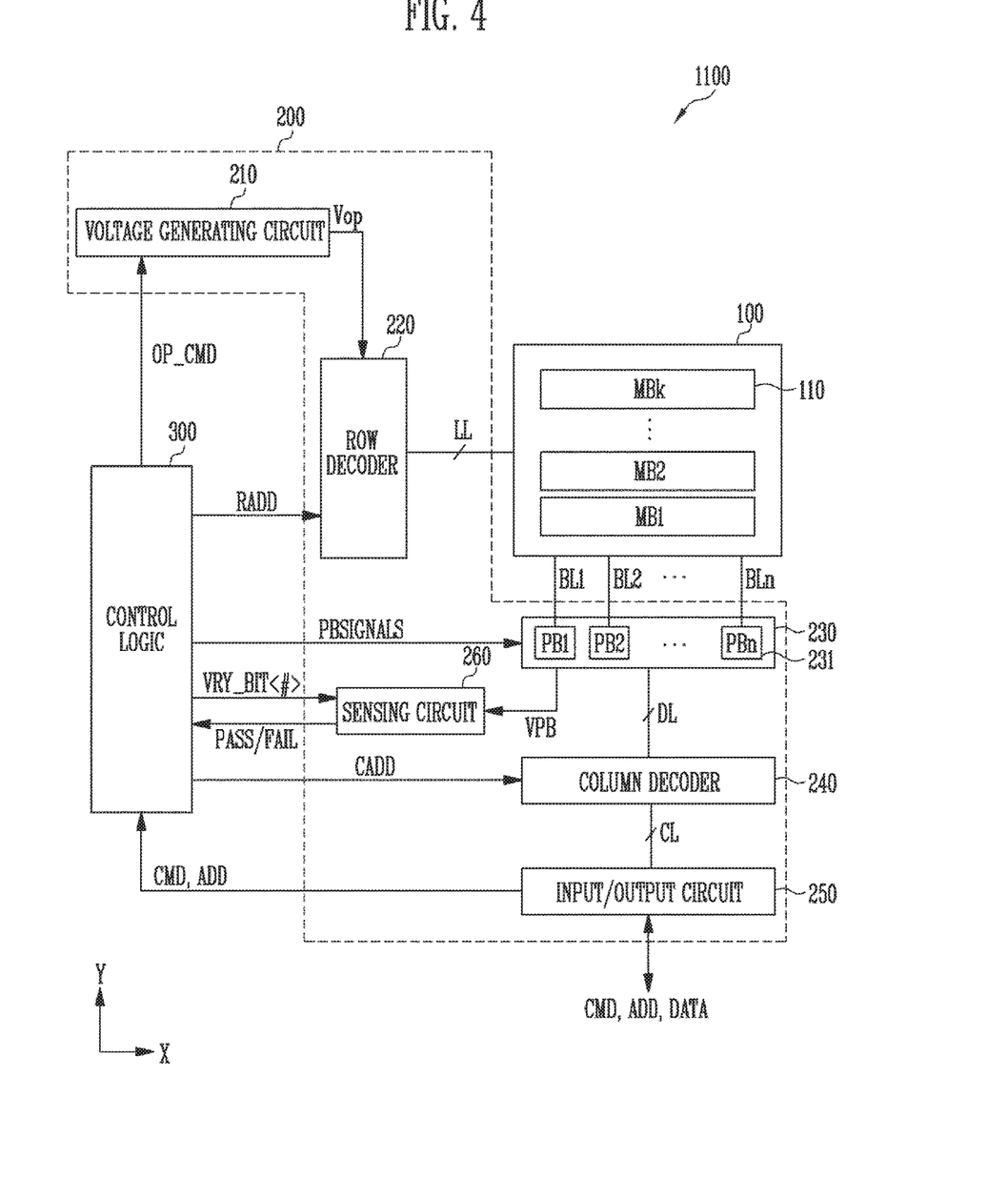
FIG. 4 is a diagram illustrating a nonvolatile memory device of FIG.

FIG. 4 is a diagram illustrating the nonvolatile memory device 1100 of FIG. 1.

Referring to FIG. 4, the nonvolatile memory device 1100 may include a memory cell array 100 that stores data. The nonvolatile memory device 1100 may include peripheral circuits 200 configured to perform a program operation for storing data in the memory cell array 100, a read operation for outputting the stored data, and an erase operation for erasing the stored data. The nonvolatile memory device 1100 may include a control logic 300 that controls the peripheral circuits 200 under the control of the memory controller 1200 (shown in FIG. 1). The memory cell array 100 may include a plurality of NAND flash memory cells, and data stored in the NAND flash memory cell may not disappear when power is cut off.

The memory cell array 100 may include a plurality of memory blocks MB1 to MBk (where k is a positive integer) 110 (hereinafter, referred to as "memory blocks 110"). Local lines LL and bit lines BL1 to BLn (where n is a positive integer) may be coupled to the memory blocks 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipe lines. The local lines LL may be coupled to the memory blocks 110, respectively, and the bit lines BL1 to BLn may be commonly coupled to the memory blocks 110. The memory blocks 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and address ADD, which are received from the memory controller 1200 (shown in FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL received from the sensing circuit 260.

Figure 5:
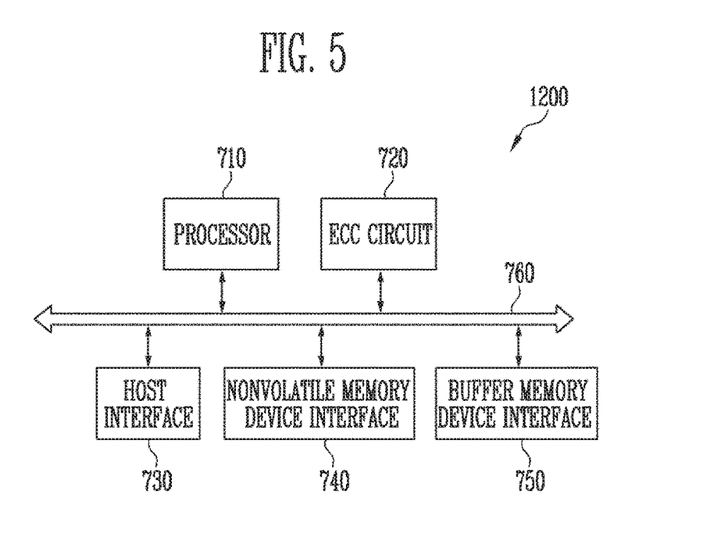
FIG. 5 is a diagram illustrating a memory controller of FIG. 1.

FIG. 5 is a diagram illustrating the memory controller 1200 of FIG. 1.

Referring to FIG. 5, the memory controller 1200 may include a processor 710, an error correction code (ECC) circuit 720, a host interface 730, a nonvolatile memory device interface 740, a buffer memory device interface 750, and a bus 760.

The bus 760 may provide channels between components of the memory controller 1200.

The processor 710 may control overall operations of the memory controller 1200 and perform a logical operation. The processor 710 may communicate with the external host 2000 through the host interface 730 and communicate with the nonvolatile memory device 1100 through the nonvolatile memory device interface 740. Also, the processor 710 may communicate with the memory buffer device 1300 through the buffer memory device interface 750.

The ECC circuit 720 may perform an ECC operation. The ECC circuit 720 may perform ECC encoding on data to be written in the nonvolatile memory device 1100 through the nonvolatile memory device interface 740. The ECC encoded data may be transferred to the nonvolatile memory device 1100 through the nonvolatile memory device interface 740. The ECC circuit 720 may perform ECC decoding on data received from the nonvolatile memory device 1100 through the nonvolatile memory device interface 740. In an embodiment, the ECC circuit 720 may be included in the nonvolatile memory device interface 740 as a component of the nonvolatile memory device interface 740.

The host interface 730 may communicate with the external host 2000 (shown in FIG. 1) under the control of the processor 710. The host interface 730 may communicate with the host 2000, using at least one of various communication methods, such as a universal serial bus (USB), a serial AT attachment (SATA), a high speed intership (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The nonvolatile memory device interface 740 may communicate with the nonvolatile memory device 1100 under the control of the processor 710. The nonvolatile memory device interface 740 may communicate a command, an address, and data with the nonvolatile memory device 1100 through a channel.

In an embodiment, the processor 710 may control an operation of the memory controller 1200 using codes. The processor 710 may load codes from a read only memory (ROM) provided inside the memory controller 1200. In another embodiment, the processor 710 may load codes from the nonvolatile memory device 1100 through the nonvolatile memory device interface 740.

In an embodiment, the bus 760 of the memory controller 1200 may be divided into a control bus and a data bus. The data bus may transmit data in the memory controller 1200, and the control bus may transmit control information such as a command and an address in the memory controller 1200. When the bus 760 is divided in to the control bus and the data bus, the data bus and the control bus are separated from each other, and may not interfere or influence with each other. The data bus may be coupled to the host interface 730, the ECC circuit 720, the nonvolatile memory device interface 740, and the buffer memory device interface 750. The control bus may be coupled to the host interface 730, the processor 710, the nonvolatile memory device interface 740, and the buffer memory device interface 750.

The buffer memory device interface 750 may communicate with the buffer memory device 1300 under the control of the processor 710. The buffer memory device interface 750 may communicate a command, an address, and data with the buffer memory device 1300 through a channel.

Figure 6:
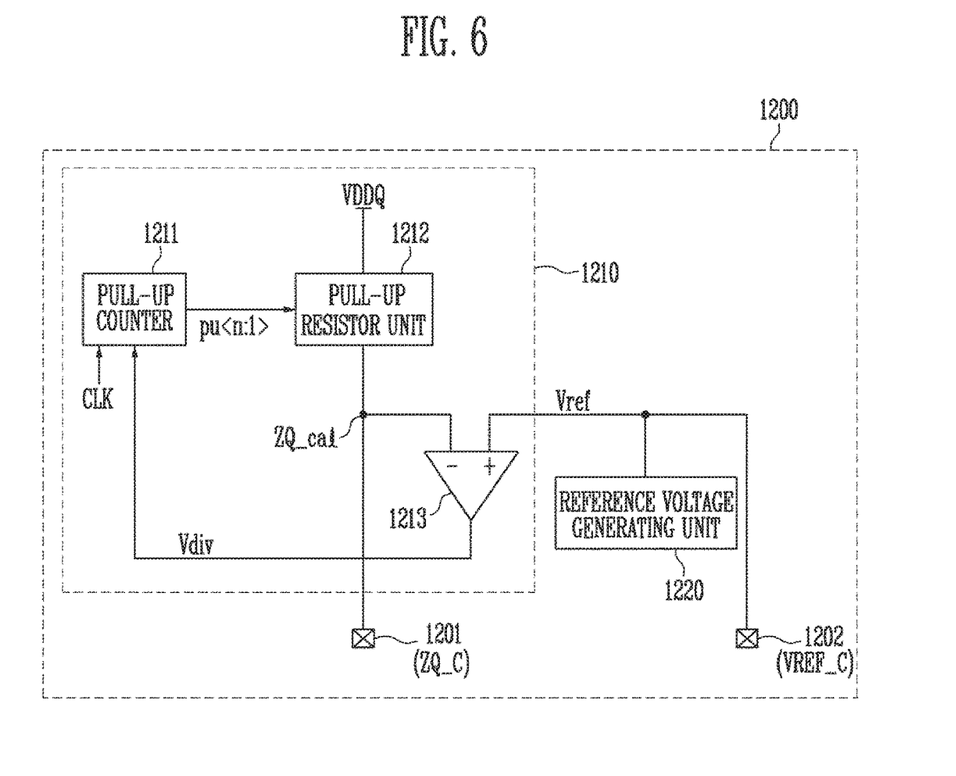
FIG. 6 is a diagram illustrating a memory controller according an embodiment of the present disclosure.

FIG. 6 is a diagram illustrating the memory controller 1200 according an embodiment of the present disclosure.

Referring to FIG. 6, the memory controller 1200 may include an impedance calibration circuit 1210 and a reference voltage generating unit 1220 that generates a reference voltage Vref. The impedance calibration circuit 1210 may include a pull-up counter 1211 that generates a pull-up code pu<n:1> in response to the reference voltage Vref generated by the reference voltage generating unit 1220, a pull-up resistor unit 1212 that varies the resistance of a pull-up resistor in response to the pull-up code pu<n:1>, and a comparator 1213.

The reference voltage generating unit 1220 may generate a reference voltage Vref for a ZQ calibration operation. In an embodiment, the reference voltage Vref may be a half of an input/output power voltage VDDQ, i.e., 0.5×VDDQ. In addition, the memory controller 1200 may always output the reference voltage Vref in a state in which the input/output power voltage VDDQ is applied. In general, since the memory controller 1200 is to output the reference voltage Vref to the outside with a large current driving capability, the memory controller 1200 may consume a large current to generate the reference voltage Vref. An external device, e.g., the buffer memory device 1300 may use the reference voltage Vref output by the memory controller 1200 in a data input operation. In other words, the buffer memory device 1300 may use the reference voltage Vref as a voltage that becomes a reference for determining whether a data signal is logic 'high' or logic 'low' in the data input operation. The buffer memory device 1300 may be configured in the form of a module including a plurality of DRAMs 1305 (shown in FIG. 2). Therefore, the memory controller 1200 may be required to generate and output the reference voltage Vref with a large current driving capability.

A node of the reference voltage Vref and a ZQ calibration node ZQ_cal may be coupled to two inputs of the comparator 1213. The comparator 1213 may generate a division voltage Vdiv by comparing the reference voltage Vref and a voltage of the ZQ calibration node ZQ_cal.

The division voltage Vdiv and a clock signal CLK may be input to the pull-up counter 1211. The pull-up counter 1211 may change a value of the pull-up code pu<n:1>, based on the division voltage Vdiv. Also, the pull-up counter 1211 may change the value of the pull-up code pu<n:1> in synchronization with the clock signal CLK.

The pull-up resistor unit 1212 may change the resistance of the pull-up resistor, based on the value of the pull-up code pu<n:1> output from the pull-up counter 1211. If the resistance of the pull-up resistor is changed, the voltage of the ZQ calibration node ZQ_cal may be changed.

In an embodiment, when the voltage of the ZQ calibration node ZQ_cal is higher than the reference voltage Vref, the pull-up counter 1211 may change the value of the pull-up code pu<n:1> in synchronization with the clock signal CLK such that the resistance of the pull-up resistor of the pull-up resistor unit 1212 increases. The pull-up resistor unit 1212 may increase the resistance of the pull-up resistor in response to the value of the pull-up code pu<n:1>. As a result, the voltage of the ZQ calibration node ZQ_cal may decrease.

In an embodiment, when the voltage of the ZQ calibration node ZQ_cal is lower than the reference voltage Vref, the pull-up counter 1211 may change the value of the pull-up code pu<n:1> in synchronization with the clock signal CLK such that the resistance of the pull-up resistor of the pull-up resistor unit 1212 decreases. The pull-up resistor unit 1212 may decrease the resistance of the pull-up resistor in response to the value of the pull-up code pu<n:1>. As a result, the voltage of the ZQ calibration node ZQ_cal may increase.

According to the impedance calibration operation described above, the voltage of the ZQ calibration node ZQ_cal may be set equal to or substantially equal to the reference voltage Vref. The impedance calibration operation may be performed in a power-up operation or be performed in response to an external request. Also, the impedance calibration operation may be performed in real time in a state in which the input/output power voltage VDDQ is applied. When the impedance calibration operation is performed in real time, there is an advantage in that the memory controller can respond to a change in input/output power voltage VDDQ, temperature, or the like in real time.

The reference voltage Vref may be output to the external device e.g., the buffer memory device 1300 through a controller reference voltage pad VREF_C 1202. In addition, the ZQ calibration node ZQ_cal may be coupled to the external device, e.g., the buffer memory device 1300 through a ZQ pad ZQ_C 1201. The reference voltage Vref may be used as a voltage that becomes a reference for determining whether a data signal is logic 'high' or logic 'low' when data is input/output between the memory controller 1200 and the buffer memory device 1300.

Figure 7:
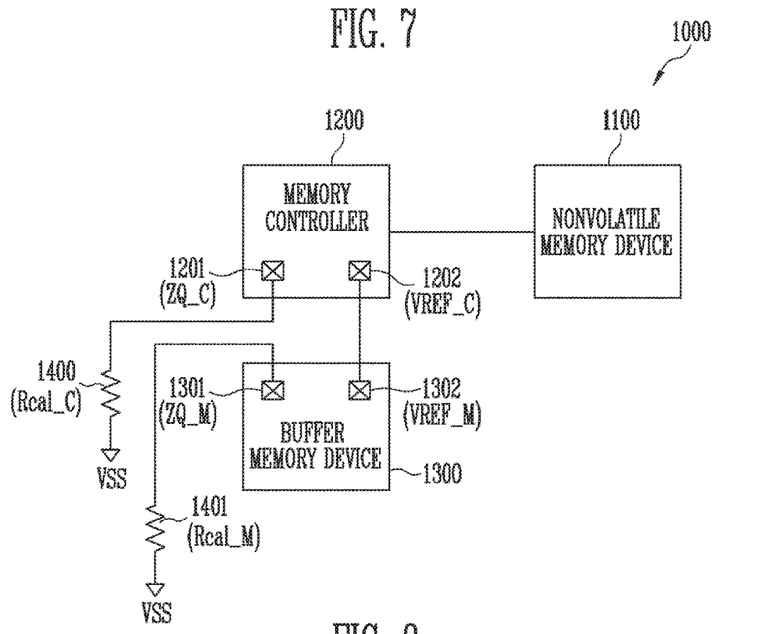
FIG. 7 is a diagram illustrating a memory system including the memory controller of FIG. 6.

FIG. 7 is a diagram illustrating a memory system including the memory controller 1200 of FIG. 6.

Referring to FIG. 7, the memory controller 1200 may output the reference voltage Vref generated by the reference voltage generating unit 1220 (shown in FIG. 6) through the controller reference voltage pad VREF_C 1202. The output reference voltage Vref may be input to the buffer memory device 1300 through a memory reference voltage pad VREF_M 1302 of the buffer memory device 1300. The reference voltage Vref may be used as a voltage that becomes a reference for determining whether a data signal is logic 'high' or logic 'low' when data is input/output between the memory controller 1200 and the buffer memory device 1300.

In the memory controller 1200, the ZQ calibration node ZQ_cal (shown in FIG. 6) may be coupled to a controller calibration resistor Rcal_C 1400 through the controller ZQ pad ZQ_C 1201. The impedance calibration operation described with reference to FIG. 6, i.e., an operation of correcting the resistance of the pull-up resistor of the pull-up resistor unit 1212 may be performed based on the controller calibration resistor Rcal_C 1400. In an embodiment, when the reference voltage Vref is, for example, 0.5×VDDQ, the resistance of the pull-up resistor of the pull-up resistor unit 1212 may be corrected to be substantially equal to that of the controller calibration resistor Rcal_C 1400. In another example, when the reference voltage Vref is, for example, ⅔×VDDQ, the resistance of the pull-up resistor of the pull-up resistor unit 1212 may be corrected to be approximately ½ of that of the controller calibration resistor Rcal_C 1400. In another example, when the reference voltage Vref is, for example, ⅓×VDDQ, the resistance of the pull-up resistor of the pull-up resistor unit 1212 may be corrected to be approximately 1.5 times greater than that of the controller calibration resistor Rcal_C 1400.

The buffer memory device 1300 may be coupled to a memory calibration resistor Rcal_M 1401 through a memory ZQ pad ZQ_M 1301. The buffer memory device 1300 may also include an impedance calibration circuit having a form similar to that of the impedance calibration circuit of the memory controller 1200, and may autonomously perform an impedance calibration operation, based on the memory calibration resistor Rcal_M 1401. The controller calibration resistor Rcal_C 1400 and the memory calibration resistor Rcal_M 1401 may be resistors having the same magnitude. In addition, when the controller calibration resistor Rcal_C 1400 is terminated to a ground voltage VSS, the memory calibration resistor Rcal_M 1401 may also be terminated to the ground voltage VSS. When the controller calibration resistor Rcal_C 1400 is terminated to the input/output power voltage VDDQ, the memory calibration resistor Rcal_M 1401 may also be terminated to the input/output power voltage VDDQ.

Figure 8:
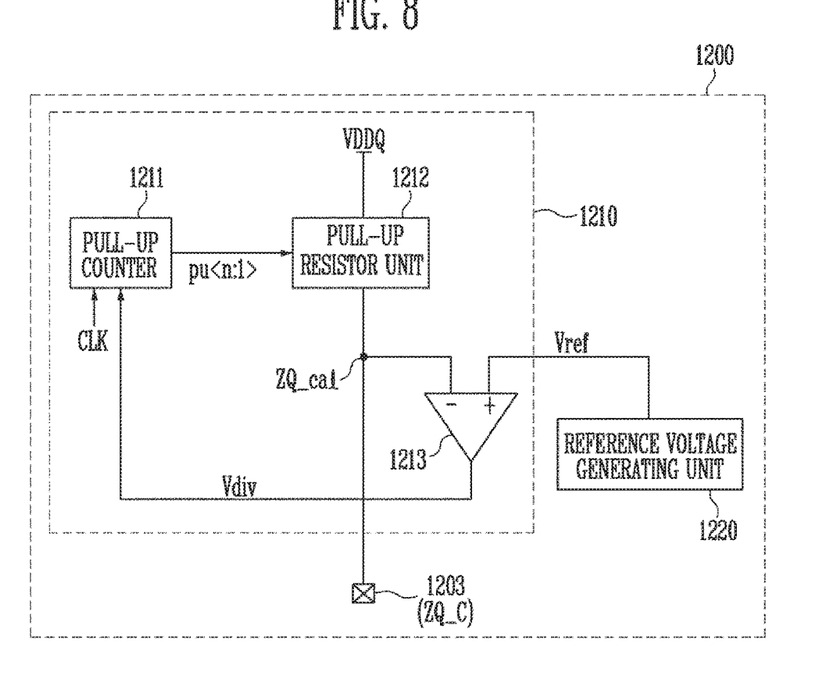
FIG. 8 is a diagram illustrating a memory controller according another embodiment of the present disclosure.

FIG. 8 is a diagram illustrating the memory controller 1200 according another embodiment of the present disclosure.

Referring to FIG. 8, unlike the memory controller 1200 described with reference to FIG. 6, the memory controller 1200 described in FIG. 8 may not include the controller reference voltage pad VREF_C 1202 for outputting the reference voltage Vref. If the impedance calibration operation is completed as described with reference to FIG. 6, the voltage of the ZQ calibration node ZQ_cal may be set equal to or substantially equal to the reference voltage Vref. Therefore, the voltage of the ZQ calibration node ZQ_cal may be output instead of the reference voltage Vref.

As described above, when the memory controller 1200 does not includes the controller reference voltage pad VREF_C 1202 for outputting the reference voltage Vref, the number of pads can be decreased, improving the overall productivity.

The memory controller 1200 may always output the reference voltage Vref in the state in which the input/output power voltage VDDQ is applied as described in FIG. 6. In this case, when the controller reference voltage pad VREF_C 1202 is removed as shown in FIG. 8, and the voltage of the ZQ calibration node ZQ_cal is output instead of the reference voltage Vref, the impedance calibration operation may be performed in real time in the state in which the input/output power voltage VDDQ is applied. In other words, the impedance calibration operation is not performed in a power-up operation or by an external request, but is always performed in the state in which the input/output power voltage VDDQ is applied. Thus, the impedance calibration operation can be performed in real time. According to the impedance calibration operation performed in real time, it is possible to efficiently counteract a change in power voltage or temperature of the memory system 100.

Figure 9:
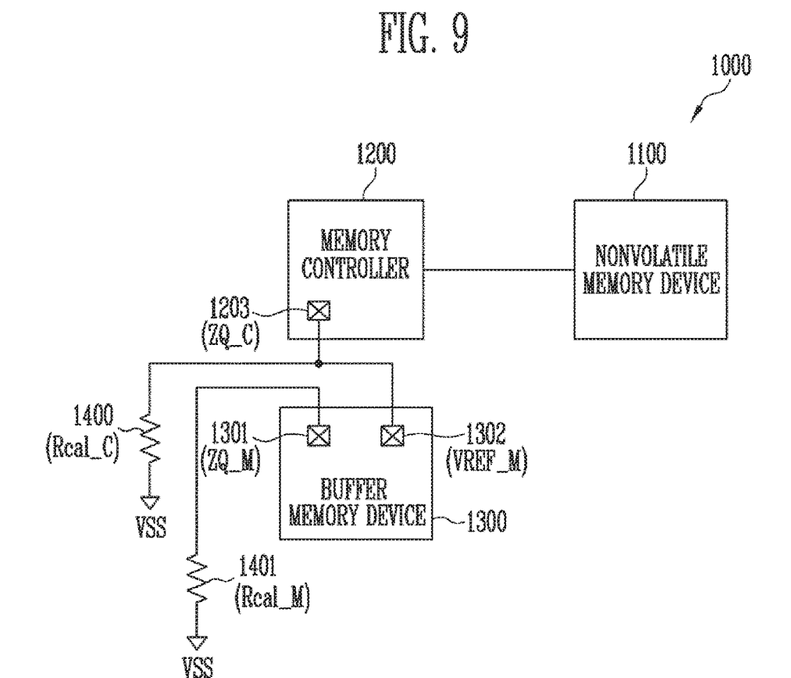
FIG. 9 is a diagram illustrating a memory system including the memory controller of FIG. 8.

FIG. 9 is a diagram illustrating a memory system including the memory controller 1200 of FIG. 8.

Referring to FIG. 9, the memory controller 1200 may not include the controller reference voltage pad VREF_C 1202 for outputting the reference voltage Vref generated by the reference voltage generating unit 1220. In addition, if the impedance calibration operation is completed as described with reference to FIG. 8, the voltage of the ZQ calibration node ZQ_cal may be set equal to or substantially equal to the reference voltage Vref. Therefore, the voltage of the ZQ calibration node ZQ_cal may be output instead of the reference voltage Vref. Consequently, as shown in FIG. 9, the controller ZQ pad ZQ_C 1203 of the memory controller 1200 may be coupled to the controller calibration resistor Rcal_C 1400 and the memory reference voltage pad VREF_M 1302. In other words, the buffer memory device 1300 may receive, from the memory controller 1200, the voltage of the ZQ calibration node ZQ_cal, which is substantially equal to the reference voltage Vref, instead of the reference voltage Vref, to use the voltage of the ZQ calibration node ZQ_cal as the reference voltage Vref. That is, the buffer memory device 1300 may use the voltage of the ZQ calibration node ZQ_cal of the memory controller 1200 as a reference for determining whether a data signal is logic 'high' or logic 'low' in the data input operation.

The memory controller 1200 of FIG. 7 may always output the reference voltage Vref in the state in which the input/output power voltage VDDQ is applied. As described with reference to FIG. 9, the memory controller 1200 may output the voltage of the ZQ calibration node ZQ_cal instead of the reference voltage Vref through the controller ZQ pad ZQ_C 1203, and the buffer memory device 1300 may receive the voltage of the ZQ calibration node ZQ_cal through the memory reference voltage pad VREF_M 1302 to use the voltage of the ZQ calibration node ZQ_cal instead of the reference voltage Vref. When a reference voltage to be used by the buffer memory device 1300 is output through the controller ZQ pad ZQ_C 1203 as shown in FIG. 9, the impedance calibration operation of the memory controller 1200 may be performed in real time. In other words, the memory controller 1200 may always output the voltage of the ZQ calibration node ZQ_cal instead of the reference voltage Vref, and hence the impedance calibration operation can also be performed in real time. According to the impedance calibration operation performed in real time, there is an advantage in that the memory controller can efficiently respond to a change in input/output power voltage VDDQ, temperature, or the like in real time.

Figure 10:
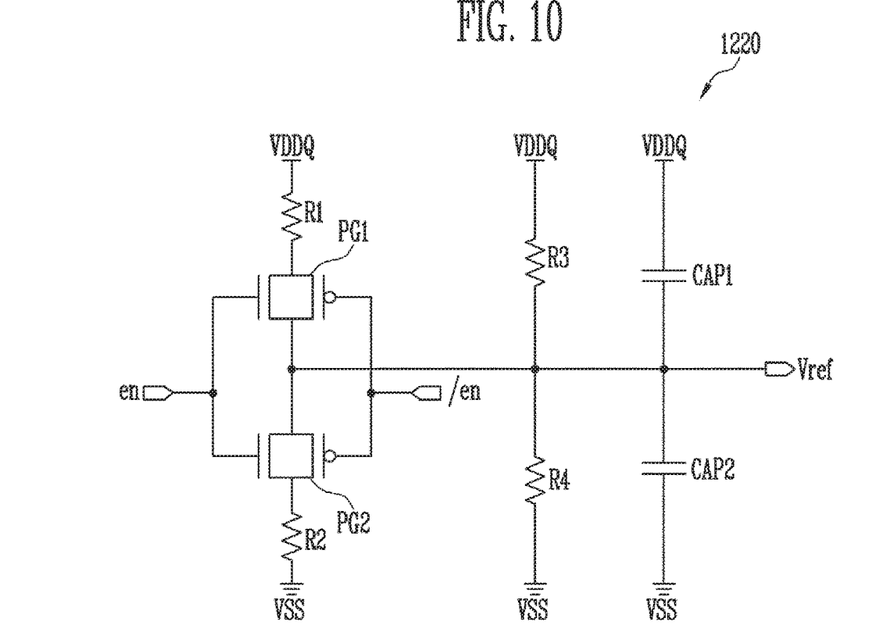
FIG. 10 is a circuit diagram illustrating in detail a reference voltage generating unit.

FIG. 10 is a circuit diagram illustrating in detail the reference voltage generating unit 1220.

Referring to FIG. 10, the reference voltage generating unit 1220 includes a first resistor R1 having one end coupled to a node of the input/output power voltage VDDQ, a first pass gate PG1 that is provided between the first resistor R1 and a node of the reference voltage Vref and is controlled by a pair of enable signals en and /en, a second resistor R2 having one end coupled to a node of the ground voltage VSS, a second pass gate PG2 that is provided between the second resistor R2 and the node of the reference voltage Vref and is controlled by the pair of enable signals en and /en, a third resistor R3 provided between the node of the input/output power voltage VDDQ and the node of the reference voltage Vref, a fourth node R4 provided between the nodes of the ground voltage VSS and the reference voltage Vref, a first capacitor CAP1 provided between the nodes of the input/output power voltage VDDQ and the reference voltage Vref, and a second capacitor CAP2 provided between the nodes of the ground voltage VSS and the reference voltage Vref.

In an embodiment, when the reference voltage Vref is, for example, 0.5×VDDQ, the resistance ratio of the first resistor R1 to the second resistor R2 may be substantially equal to that of the third resistor R3 to the fourth resistor R4, and each resistance ratio may be 1:1. However, the first resistor R1 and the second resistor R2 may have resistance values lower than those of the third resistor R3 and the fourth resistor R4. According to the above-described configuration, noise can be reduced when the impedance calibration operation is performed, and current consumption can be reduced when the impedance calibration operation is not performed.

Figure 11:
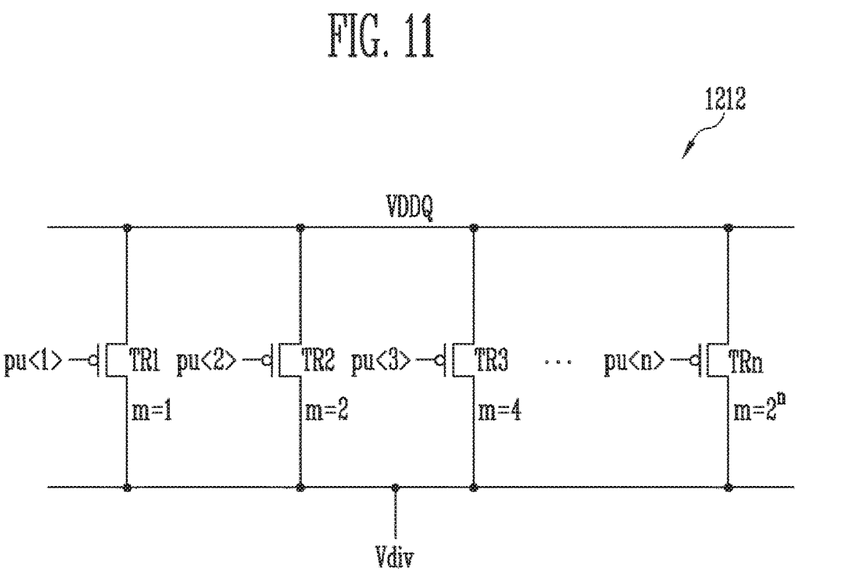
FIG. 11 is a circuit diagram illustrating in detail a pull-up resistor unit.

FIG. 11 is a circuit diagram illustrating in detail the pull-up resistor unit 1212.

Referring to FIG. 11, the pull-up resistor unit 1212 may include first to nth transistors TR1 to TRn. Bits of a pull-up code pu<n:1> output from the pull-up counter 1211 may be input to gate nodes of the first to nth transistors TR1 to TRn, respectively, and an input/output power voltage VDDQ is applied to source nodes of the first to nth transistors TR1 to TRn. A division voltage Vdiv may be commonly coupled to drain nodes of the first to nth transistors TR1 to TRn.

The transistors have different resistance values. Among the transistors, transistors may have resistance values that are two times, four times, eight times, . . . , i.e. $2^n$ times the resistance value of a transistor to which the most significant bit pu<n> of the pull-up code pu<n:1> is input. In other words, the transistors may have sizes that are two times, four times, eight times, . . . , i.e. $2^n$ times the size of a transistor to which the last significant bit pu1<1> of the pull-up code pu<n:1> is input. In an embodiment, the first transistor TR1 to which the last significant bit pu<1> of the pull-up code pu<n:1> is input may be configured with one transistor, and the second transistor TR2 to which a second least significant bit pu<2> of the pull-up code pu<n:1> is input may be configured with two transistors having the same size of the first transistor TR1, which are coupled in parallel to each other. When the two transistors are coupled in parallel to each other, the two transistors share source, drain, and gate nodes with each other. In addition, the third transistor TR3 to which a third least significant bit pu<3> of the pull-up code pu<n:1> is input may be configured with four transistors having the same size of the first transistor TR1, which are coupled in parallel to each other. When the sizes of pull-up transistors are configured in this manner, is called a binary relationship.

According to the above-described configuration, if logical values of the pull-up code pu<n:1> are changed by '1,' the pull-up resistor unit 1212 can decrease or increase resistance values in proportion to the variation.

Figure 12:
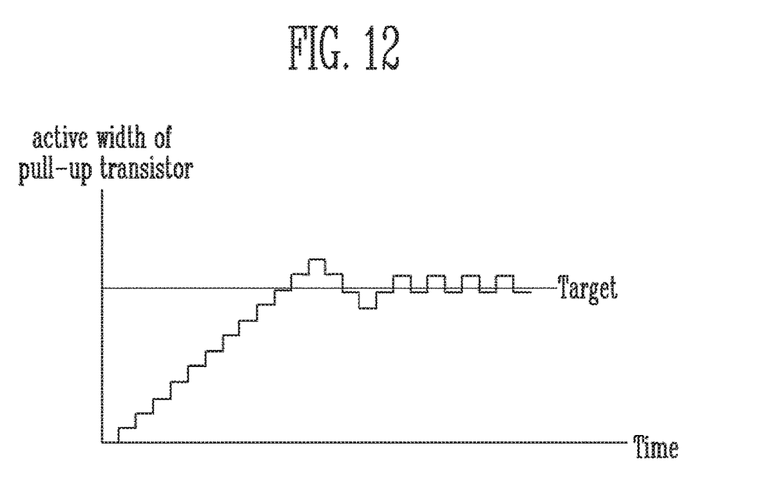
FIG. 12 is a diagram illustrating an impedance calibration operation according to the present disclosure.

FIG. 12 is a diagram illustrating the impedance calibration operation according to the present disclosure.

Referring to FIG. 12, a change in resistance of the pull-up resistor of the pull-up resistor unit 1212 described with reference to FIG. 11 in the impedance calibration operation is illustrated. The resistance of the pull-up resistor may be controlled by on/off of the transistors having different widths as described with reference to FIG. 11.

When the impedance calibration operation starts, the first to nth transistors included in the pull-up resistor unit 1212 may all be in an off-state. In addition, the reference voltage generating unit 1220 of FIG. 8 may generate the reference voltage Vref. In an embodiment, the reference voltage Vref may be a half of the input/output power voltage VDDQ, i.e., 0.5×VDDQ. Since the first to nth transistors included in the pull-up resistor unit 1212 may all be in the off-state, the voltage of the ZQ calibration node ZQ_cal of FIG. 8 may be a voltage close to the ground voltage VSS. Therefore, the comparator 1213 may output a result that the voltage of the ZQ calibration node ZQ_cal is lower than the reference voltage Vref, and the pull-up counter 1211 may allow the value of the pull-up code pu<n:1> to be sequentially changed by one bit in synchronization with the clock signal, based on the result. The pull-up resistor unit 1212 may decrease the resistance of the pull-up resistor by controlling the on/off of the first to nth transistors of FIG. 11 in response to the change in value of the pull-up code pu<n:1>. In other words, the pull-up resistor unit 1212 may allow the widths of activated pull-up transistors to be gradually increased by sequentially turning on/off the first to nth transistors of FIG. 11 in response to the value change of the pull-up code pu<n:1> by one bit in synchronization with the clock signal. As the resistance of the pull-up resistor decreases, the voltage of the ZQ calibration node ZQ_cal gradually increases.

In addition, if the voltage of the ZQ calibration node ZQ_cal is greater than a target voltage Target, i.e., the reference voltage Vref, the comparator 1213 may output a result that the voltage of the ZQ calibration node ZQ_cal is higher than the reference voltage Vref, and the pull-up counter 1211 may allow the value of the pull-up code pu<n:1> to be sequentially changed by one bit in synchronization with the clock signal, based on the result. The pull-up resistor unit 1212 may increase the resistance of the pull-up resistor by controlling the on/off of the first to nth transistors of FIG. 11 in response to the change in value of the pull-up code pu<n:1>. In other words, the pull-up resistor unit 1212 may allow the widths of activated pull-up transistors to be gradually decreased by sequentially turning on/off the first to nth transistors of FIG. 11 in response to the value change of the pull-up code pu<n:1> by one bit in synchronization with the clock signal. As the resistance of the pull-up resistor increases, the voltage of the ZQ calibration node ZQ_cal gradually decreases.

According to such a feedback operation, the voltage of the ZQ calibration node ZQ_cal can be set as a voltage equal to or substantially equal to the target voltage Target, i.e., the reference voltage Vref.

Figure 13:
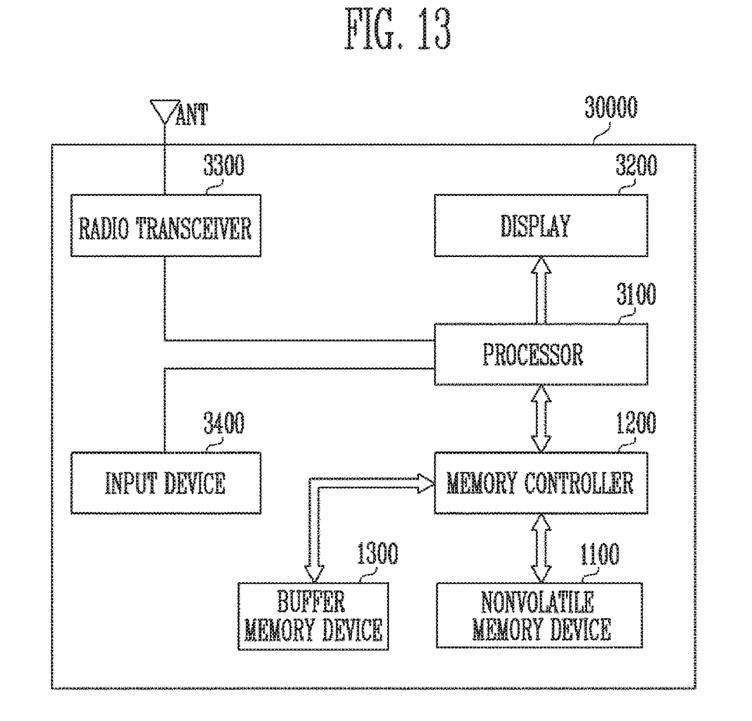
FIG. 13 is a diagram illustrating another embodiment of the memory system including the memory controller shown in FIG. 1.

FIG. 13 is a diagram illustrating an application example of the memory system 1000 including the memory controller 1200. The memory system 1000 may correspond to the memory system described in FIGS. 1 and 2. The memory controller 1200 may correspond to the memory controller described in FIGS. 5 to 8.

Referring to FIG. 13, the memory system 30000 may be implemented as a cellular phone, a smart phone, a tablet PC, a personal digital assistant (PDA), or a wireless communication device. The memory system 30000 may include a nonvolatile memory device 1100 and a memory controller 1200 capable of controlling an operation of the nonvolatile memory device 1100. The memory controller 1200 may control a data access operation of a buffer memory device 1300, e.g., a program operation, an erase operation, a read operation, or the like under the control of a processor 3100.

Data programmed in the nonvolatile memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the nonvolatile memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the nonvolatile memory device 1100 may be implemented as a part of the processor 3100, or be implemented as a chip separate from the processor 3100.

Figure 14:
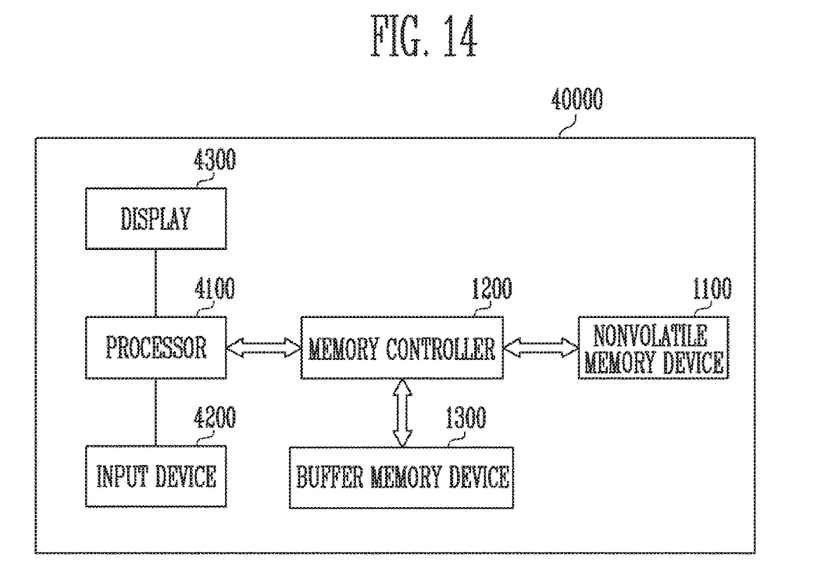
FIG. 14 is a diagram illustrating another embodiment of the memory system including the memory controller shown in FIG. 1.

FIG. 14 is a diagram illustrating another application example of the memory system 1000 including the memory controller 1200. The memory system 1000 may correspond to the memory system described in FIGS. 1 and 2. The memory controller 1200 may correspond to the memory controller described in FIGS. 5 to 8.

Referring to FIG. 14, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a nonvolatile memory device 1100 and a memory controller 1200 capable of controlling a data processing operation of the nonvolatile memory device 1100. The memory controller 1200 may control a data access operation of a buffer memory device 1300, e.g., a program operation, an erase operation, a read operation, or the like under the control of a processor 4100.

The processor 4100 may output data stored in the nonvolatile memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the nonvolatile memory device 1100 may be implemented as a part of the processor 4100, or be implemented as a chip separate from the processor 4100.

Figure 15:
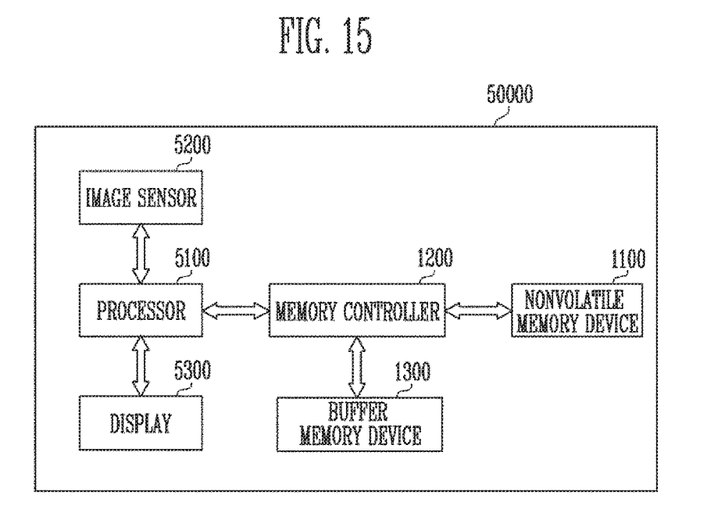
FIG. 15 is a diagram illustrating another embodiment of the memory system including the memory controller shown in FIG. 1.

FIG. 15 is a diagram illustrating another application example of the memory system 1000 including the memory controller 1200. The memory system 1000 may correspond to the memory system described in FIGS. 1 and 2. The memory controller 1200 may correspond to the memory controller described in FIGS. 5 to 8.

Referring to FIG. 15, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a nonvolatile memory device 1100 and a memory controller 1200 capable of controlling a data processing operation of the nonvolatile memory device 1100, e.g., a program operation, an erase operation, or a read operation. The memory controller 1200 may control a data access operation of a buffer memory device 1300, e.g., a program operation, an erase operation, a read operation, or the like under the control of a processor 5100.

An image sensor 5200 of the memory system 50000 may convert an optical image into digital signals, and the converted digital signals may be transmitted to the processor 5100 or the memory controller 1200. Under the control of the processor 5100, the converted digital signals may be output through a display 5300, or be stored in the nonvolatile memory device 1100 through the memory controller 1200. In addition, data stored in the nonvolatile memory device 1100 may be output through the display 5300 under the control of the processor 5100 or the memory controller 1200.

In some embodiments, the nonvolatile memory controller 1200 capable of controlling an operation of the nonvolatile memory device 1100 may be implemented as a part of the processor 5100, or be implemented as a chip separate from the processor 5100.

Figure 16:
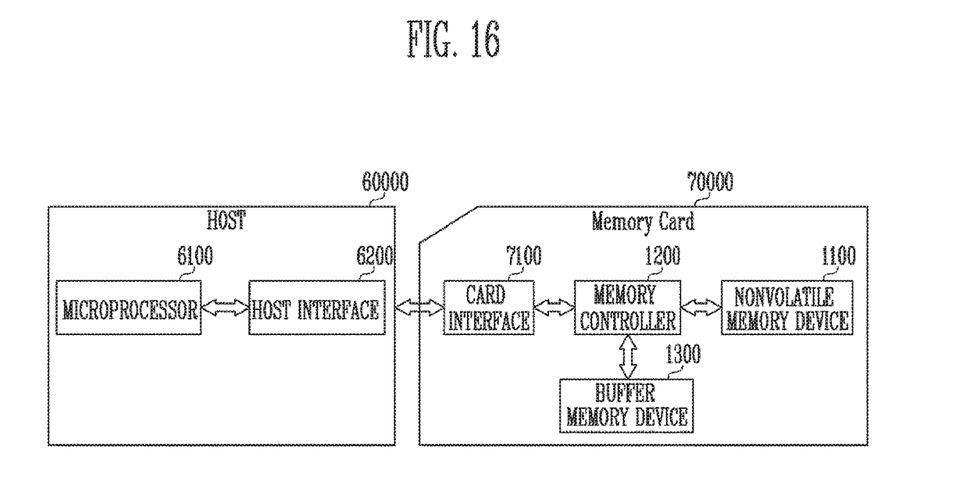
FIG. 16 is a diagram illustrating another embodiment of the memory system including the memory controller shown in FIG. 1.

FIG. 16 is a diagram illustrating another application example of the memory system 1000 including the memory controller 1200. The memory system 1000 may correspond to the memory system described in FIGS. 1 and 2. The memory controller 1200 may correspond to the memory controller described in FIGS. 5 to 8.

Referring to FIG. 16, the memory system 70000 may be implemented as a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In some embodiments, the card interface 7100 may be a secure digital (SD) card interface or a multi-media card (MMC) interface, but the present disclosure is not limited thereto. The memory controller 1200 may control a data access operation of a buffer memory device 1300, e.g., a program operation, an erase operation, a read operation, or the like.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

According to the present disclosure, in the impedance calibration circuit of the memory system, a voltage output through the controller ZQ pad is used as a reference voltage in the buffer memory device, so that the number of pads of the memory controller can be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a buffer memory device including a reference voltage pad;
a memory controller including a controller ZQ pad; and
a controller calibration resistor,
wherein the reference voltage pad, the controller ZQ pad, and the controller calibration resistor are coupled to each other,
wherein the memory controller includes a reference voltage generating unit configured to generate a reference voltage,
wherein the memory controller includes a comparator that has a first input and a second input, and
wherein the first input is coupled to the controller ZQ pad, and the reference voltage is input to the second input.

2. The memory system of claim 1,
wherein, when an impedance calibration operation is activated, a voltage output to the controller ZQ pad is substantially equal to the reference voltage.

3. The memory system of claim 2, wherein the memory controller includes a pull-up resistor unit coupled to the controller ZQ pad,
wherein, when the impedance calibration operation is activated, the pull-up resistor unit is configured to change the resistance of a pull-up resistor, based on the resistance of the controller calibration resistor and the reference voltage.

4. The memory system of claim 3, wherein the pull-up resistor unit includes a plurality of transistors coupled in parallel to each other,
wherein the widths of the plurality of transistors are configured in a binary relationship.

5. The memory system of claim 3, wherein the memory controller includes a pull-up counter configured to generate a pull-up code,
wherein the pull-up counter generates the pull-up code that adjusts the resistance of the pull-up resistor of the pull-up resistor unit in synchronization with a clock signal.

6. The memory system of claim 3, wherein, when an input/output power voltage is applied, the memory controller performs the impedance calibration operation in real time.

7. The memory system of claim 2, wherein an input/output power voltage of the memory controller is approximately two times greater than the reference voltage.

8. The memory system of claim 2, wherein the buffer memory device determines whether a data signal is logic 'high' or logic 'low' in a data input operation.

9. The memory system of claim 8, further comprising a memory calibration resistor coupled to the buffer memory device,
wherein the memory calibration resistor has a resistance substantially equal to that of the controller calibration resistor.

10. The memory system of claim 8, wherein the buffer memory device includes a plurality of dynamic random access memories (DRAMs),
wherein the plurality of DRAMs share a data transmission line for exchanging data with the memory controller.

11. The memory system of claim 1, wherein the memory controller includes a pull-up counter configured to generate a pull-up code,
wherein the pull-up counter adjusts the pull-up code in synchronization with a clock signal, based on an output voltage of the comparator.

12. A memory system comprising:
a buffer memory device;
a memory controller including a first pad;
a controller calibration resistor coupled to the memory controller through the first pad; and
a memory calibration resistor coupled to the buffer memory device through a second pad,
wherein the memory controller performs an impedance calibration operation, based on the resistance of the controller calibration resistor,
wherein the buffer memory device determines whether a data signal is logic 'high' or logic 'low' in a data input operation, based on a voltage output from the memory controller through the first pad, and
wherein the buffer memory device autonomously performs an impedance calibration operation, based on the resistance of the memory calibration resistor.

13. The memory system of claim 12, wherein the buffer memory device includes a third pad,
wherein the buffer memory device receives, through the third pad, the voltage output through the first pad.

14. The memory system of claim 12, wherein the memory controller includes a reference voltage generating unit configured to generate a reference voltage,
wherein, when the impedance calibration operation is activated, the voltage output through the first pad is substantially equal to the reference voltage.

15. The memory system of claim 14, wherein the memory controller includes an impedance calibration circuit coupled to the first pad,
wherein the impedance calibration circuit is configured to change the voltage output through the first pad, based on the resistance of the controller calibration resistor and the reference voltage.

16. The memory system of claim 12, wherein, when an input/output power voltage is applied, the memory controller performs the impedance calibration operation in real time.

17. The memory system of claim 12, wherein the buffer memory device includes a double data rate fourth-generation synchronous dynamic random access memory (DDR4 SDRAM).

18. The memory system of claim 12, wherein the buffer memory device includes a plurality of DRAMs,
wherein the plurality of DRAMs share a data transmission line for exchanging data with the memory controller.

19. A transmission system comprising:
first and second devices; and
a transmission line suitable for transferring a signal between the first and second devices,
wherein the first device matches impedances between the first device and the transmission line with reference to a first calibration resistance, and
wherein the second device matches impedances between the second device and the transmission line with reference to a second calibration resistance and the voltage of the first calibration resistance when the first device completes the impedance matching.

* * * * *